(12) United States Patent
Kuramochi

(10) Patent No.: US 7,375,433 B2
(45) Date of Patent: May 20, 2008

(54) SEMICONDUCTOR DEVICE PACKAGING SUBSTRATE AND SEMICONDUCTOR DEVICE PACKAGING STRUCTURE

(75) Inventor: Toshiyuki Kuramochi, Nagano (JP)

(73) Assignee: Shinko Electric Industries Co., Ltd., Nagano-shi (JP)

( * ) Notice: Subject to any disclaimer, the term of this patent is extended or adjusted under 35 U.S.C. 154(b) by 183 days.

(21) Appl. No.: 11/423,056

(22) Filed: Jun. 8, 2006

(65) Prior Publication Data

US 2006/0281220 A1 Dec. 14, 2006

(30) Foreign Application Priority Data

Jun. 9, 2005 (JP) ............................. 2005-169894

(51) Int. Cl.
*H01L 23/22* (2006.01)
*H01L 23/24* (2006.01)
*H01L 23/48* (2006.01)
*H01L 23/52* (2006.01)
*H01L 23/40* (2006.01)

(52) U.S. Cl. ................. 257/778; 257/687; 257/E23.021
(58) Field of Classification Search ........ 257/737–738, 257/685–687, 777–794, E23.021
See application file for complete search history.

(56) References Cited

U.S. PATENT DOCUMENTS 6,815,831 B2 * 11/2004 Dias ........................... 257/778
2007/0257362 A1 * 11/2007 Karashima et al. ......... 257/737

FOREIGN PATENT DOCUMENTS

JP 2002-329744 11/2002

* cited by examiner

*Primary Examiner*—Cuong Q Nguyen
(74) *Attorney, Agent, or Firm*—Rankin, Hill & Clark LLP

(57) ABSTRACT

A packaging substrate for a semiconductor device includes: a solder resist on a surface of the packaging substrate, the solder resist having a first opening portion for mounting the semiconductor device; and a speed adjusting opening portion for adjusting a flow speed of an underfill resin when the underfill resin is provided, the adjusting section being positioned in vicinity of the first opening portion of the solder resist.

10 Claims, 19 Drawing Sheets

SEMICONDUCTOR DEVICE PACKAGING SUBSTRATE AND SEMICONDUCTOR DEVICE PACKAGING STRUCTURE

This application claims foreign priority based on Japanese Patent application No. 2005-169894, filed Jun. 9, 2005, the content of which is incorporated herein by reference in its entirety.

BACKGROUND OF THE INVENTION

1. Field of the Invention

The present invention relates to a semiconductor device packaging substrate and a semiconductor device packaging structure, and more particularly, a semiconductor device packaging substrate and a semiconductor device packaging structure in which an underfill resin is filled between the packaging substrate and a semiconductor device mounted to the packaging substrate in flip-chip bonding.

2. Description of the Related Art

As a method of packaging a semiconductor device which is high in density onto a packaging substrate, flip-chip bonding is used frequently. According to this flip-chip bonding, the semiconductor device is mounted by providing solder bumps on the bottom surface of the semiconductor device as external connection terminals, then setting this semiconductor device in a face-down state to the packaging substrate, and then bonding the solder bumps to electrodes formed on the packaging substrate.

FIG. 1 shows an example of a packaging substrate 1 on which a semiconductor device (semiconductor element) 5 is mounted by the flip-chip bonding in the related art. In FIG. 1, an example in which the semiconductor device 5, such as DRAM, having a center pad structure is mounted on the packaging substrate 1 is shown.

The packaging substrate 1 is a printed-wiring board, and predetermined wiring patterns, electrodes, etc. are formed on its surface. Also, a solder resist 2 for protecting the wiring patterns, the electrodes, etc. is provided on the surface of the packaging substrate 1.

The solder resist 2 is a resin that has insulating performance and also has a function of preventing adhesion of the solder. An opening portion 3 is formed in a portion, in which the electrodes to be bonded to the solder bumps formed on the semiconductor device 5 are formed, of a packaging area 6 of the solder resist 2, in which the semiconductor device 5 is mounted. Therefore, the electrodes (not shown) bonded to the bumps formed on the packaging substrate 1 are exposed to the outside via the opening portion 3.

In the meanwhile, in a case where a difference in thermal expansion between the packaging substrate 1 and the semiconductor device 5 is large, a stress caused due to such difference in thermal expansion in heating is applied to the solder bumps when the semiconductor device 5 is flip-chip bonded to the packaging substrate 1. Thus, a problem arises in packaging reliability. Therefore, in the related art, a stress caused due to a difference in thermal expansion is suppressed by providing an underfill resin 7 between the semiconductor device 5 and the packaging substrate 1 after the semiconductor device 5 is flip-chip mounted on the packaging substrate 1, and thus the packaging reliability is improved (see JP-A-2002-329744, for example).

FIG. 2 is a plan view showing a process of providing the underfill resin 7 between the packaging substrate 1 and the semiconductor device 5. Because the underfill resin 7 is provided between the packaging substrate 1 and the semiconductor device 5, illustration of the semiconductor device 5 is omitted herein and only its packaging area 6 is illustrated, for convenience of illustration.

In order to provide the underfill resin 7, a liquid underfill resin 7 is injected between the packaging substrate 1 and the semiconductor device 5 from an injection starting position 9. In an example shown in FIG. 2, the injection starting position 9 is set in a position of the bottom portion of the opening portion 3 in FIG. 2. The underfill resin 7 when injected from the injection starting position 9 flows upward in FIG. 2 to spread into a space between the packaging substrate 1 and the semiconductor device 5.

In this injection, a flow end surface 7A as a top end portion of the underfill resin 7 is not formed as a linear end but a curved end shown in FIG. 2. This is caused due to the fact that a flow speed of the liquid underfill resin 7 in areas that are located along edge portions 3A of the opening portion 3 and outer peripheral portions 6A of the semiconductor device 5 is higher than that in other areas. More concretely, a flow speed V2 at the edge portion 3A and a flow speed V3 at the outer peripheral portion 6A is higher than a flow speed of the underfill resin 7 on the solder resist 2 indicated with an arrow V1 in FIG. 2 (V1<V2, V1<V3).

Also, FIG. 4 shows an example in which two opening portions 3, 4 are formed in the solder resist 2 to mount the semiconductor device having the pad structure in two rows. As shown in FIG. 4, when the opening portions 3, 4 are formed in parallel and then the underfill resin 7 is injected in the direction that is perpendicular to the opening portions 3, 4, particularly the underfill resin 7 goes around fast conspicuously.

In this manner, a flow speed of the underfill resin 7 is not uniform on the packaging substrate 1, nevertheless this problem was not handled properly in the related art. For this reason, a curved shape of the flow end surface 7A becomes prominent based on a difference in speed when the underfill resin 7 flows from the injection starting position 9 to the opposite side. Then, because the portion of the underfill resin 7 whose flow speed is fast flows to go around the portion whose flow speed is slow, voids 8 are generated in the inside of the underfill resin 7 under certain circumstances, as shown in FIG. 3 and FIG. 5.

FIG. 6A shows an SAT (Scanning Acoustic Tomography) image in which voids 8 are generated in the inside of the underfill resin 7 when the underfill resin 7 is injected between the packaging substrate 1 and the semiconductor device 5 as the first related art. FIG. 6B shows an image when surface grinding is performed in the state shown in FIG. 6A.

FIG. 6C is a cross-sectional view of a semiconductor device packaging structure along the line A-A' of FIG. 6A. In this case, an Au stud bump 11 formed on the semiconductor device 5 and a substrate conductor (electrode) 13 formed on the packaging substrate 1 is connected via a solder 12. In FIG. 6C, voids are not generated.

FIG. 6D is a cross-sectional view of the semiconductor device packaging structure along the line B-B' of FIG. 6A. In this case, the void 8 is generated in the inside of the underfill resin 7 around the solder 12 between the semiconductor device 5 and the packaging substrate 1.

FIG. 6E is a cross-sectional view of the semiconductor device packaging structure along the line C-C' of FIG. 6A. In this case, the void 8 is generated in the inside of the underfill resin 7 above the packaging substrate 1 between the semiconductor device 5 and the packaging substrate 1.

In this manner, in case the voids 8 are generated in the inside of the underfill resin 7, it is possible that an air in the voids 8 is expanded by the later heating resulting a breakage of the underfill resin 7, or the underfill resin 7 cannot sufficiently absorb a stress caused between the packaging substrate 1 and the semiconductor device 5. Thus, such a problem is caused that the packaging reliability is deteriorated.

SUMMARY OF THE INVENTION

The present invention has been made in view of the above circumstances, and provides a semiconductor device packaging substrate and a semiconductor device packaging structure, capable of preventing generation of voids in an underfill resin.

In some implementations, a packaging substrate of the invention for a semiconductor device comprises:

a solder resist on a surface of the packaging substrate, the solder resist having a first opening portion for mounting the semiconductor device; and an adjusting section for adjusting a flow speed of an underfill resin when the underfill resin is provided, the adjusting section being positioned in vicinity of the first opening portion of the solder resist.

According to the above invention, since the adjusting section is provided in the peripheral portion of the first opening portion of the solder resist, the underfill resin moves over the adjusting section and is filled between the semiconductor device and the semiconductor device packaging substrate when providing the underfill resin. In this movement, since the adjusting section adjusts a flow speed of the underfill resin, the underfill resin can move uniformly and also generation of the voids in the underfill resin can be prevented.

In the packaging substrate of the invention, the adjusting section includes a second opening portion formed in the solder resist.

According to the above invention, since the adjusting section is formed by the second opening portion formed in the solder resist, such adjusting section can be formed simultaneously with the first opening portion, and thus the adjusting section can be formed easily.

In the packaging substrate of the invention, the adjusting section includes a convex portion formed on the solder resist.

According to the above invention, since the adjusting section is formed by the convex portion formed on the solder resist, such adjusting section can be formed simultaneously when the solder resist is formed, and thus the adjusting section can be formed easily.

In the packaging substrate of the invention, the adjusting section is rectangular-shaped when viewed from a top.

According to the above invention, since the adjusting section is shaped into a rectangular shape as a simple shape, the formation of the adjusting section can be executed simply.

In the packaging substrate of the invention, the adjusting section is polygonal-shaped when viewed from a top.

According to the above invention, since the adjusting section is shaped into a polygonal shape, a flow speed of the underfill resin can be decreased largely with a small space.

In the packaging substrate of the invention, the adjusting section is provided on one side of the first opening portion, the side that is opposite to an injection starting position of the underfill resin.

According to the above invention, it can be prevented that the underfill resin flows out excessively from the opposite side of the first opening portion.

In the packaging substrate of the invention, the adjusting section is formed in a position partially covering an outer periphery of a region in which the semiconductor device is mounted.

According to the above invention, since the adjusting section is provided in the outer periphery, in which a flow speed of the underfill resin is fast, of the region, the underfill resin can be provided in further uniform state.

In some implementations, a packaging structure of the invention comprises:

a packaging substrate;

a semiconductor device mounted in the packaging substrate in flip-chip bonding; and an underfill resin provided between the semiconductor device and the packaging substrate, wherein the packaging substrate includes:

a solder resist on a surface of the packaging substrate, the solder resist having a first opening portion for mounting the semiconductor device; and an adjusting section for adjusting a flow speed of the underfill resin when the underfill resin is provided, the adjusting section being positioned in vicinity of the first opening portion of the solder resist, and the underfill resin is provided in a region including the first opening portion and the adjusting section.

According to the above invention, since the underfill resin moves over the adjusting section when providing the underfill resin, the flow speed is adjusted and therefore generation of the voids in the underfill resin can be prevented. Also, since the underfill resin is provided in the region including the adjusting section, after the underfill resin is provided, the underfill resin can be secured without fail on the semiconductor device packaging substrate by an anchor effect of the adjusting section.

According to the present invention, since the adjusting section adjusts the flow speed of the underfill resin, the underfill resin can move uniformly, and also generation of the voids in the underfill resin can be prevented.

DESCRIPTION OF THE PRFERRED EMBODIMENTS

Next, a best mode for carrying out the present invention will be explained with reference to the drawings hereinafter.

Figure 1:
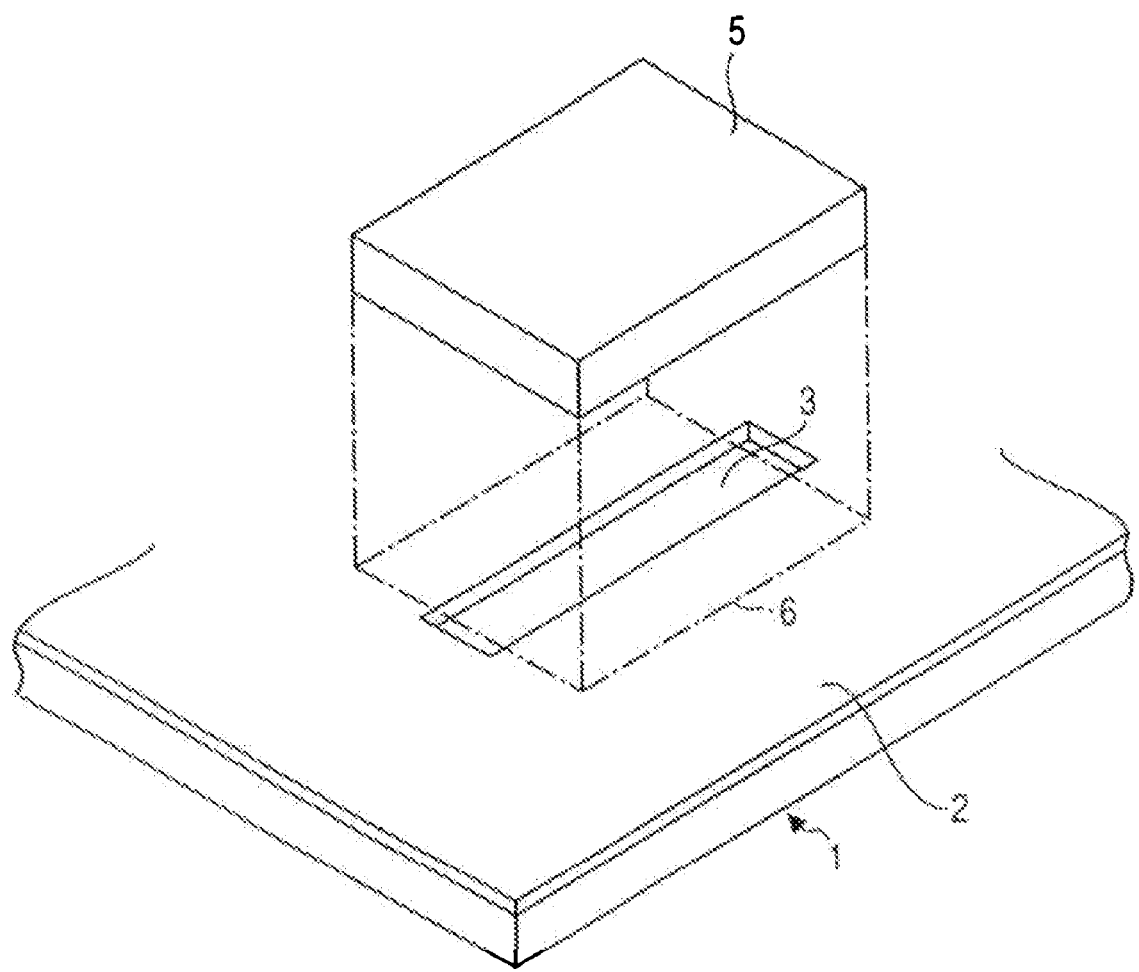
FIG. 1 is a perspective view showing a first related art of a packaging substrate.
Figure 2:
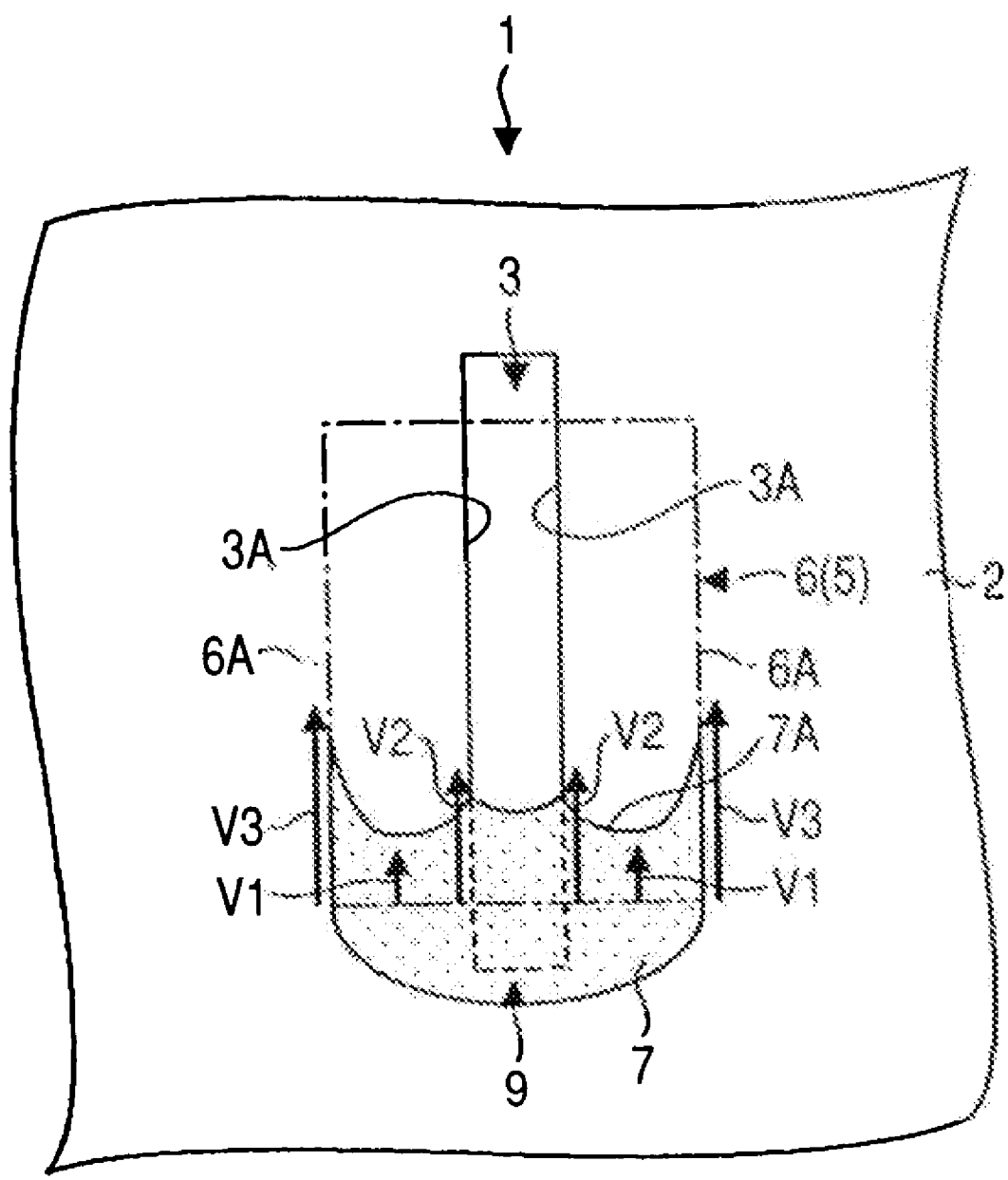
FIG. 2 is a view explaining a flow of an underfill resin in the packaging substrate according to the first related art.
Figure 3:
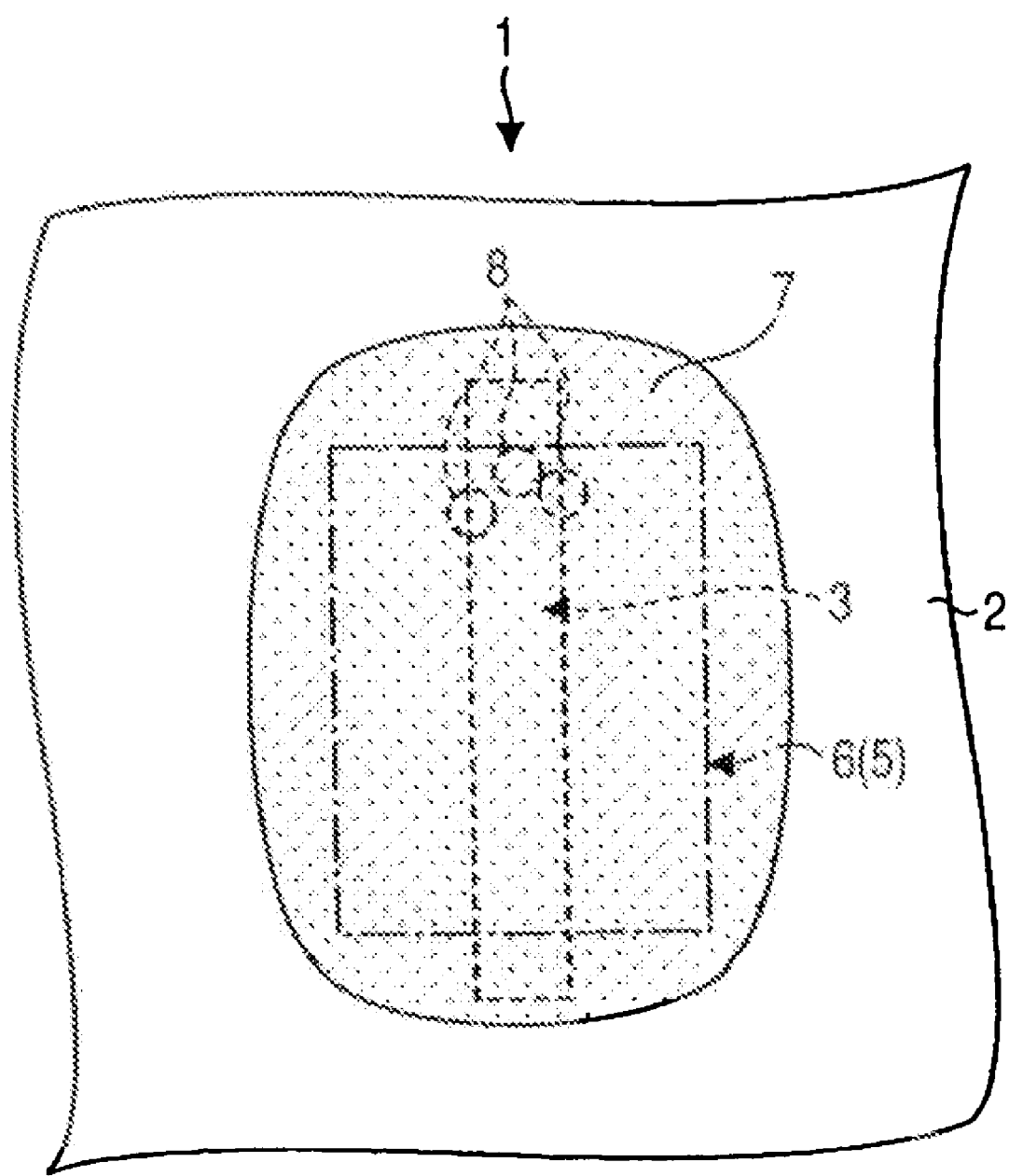
FIG. 3 is a view explaining a problem that is caused in the packaging substrate according to the first related art.
Figure 4:
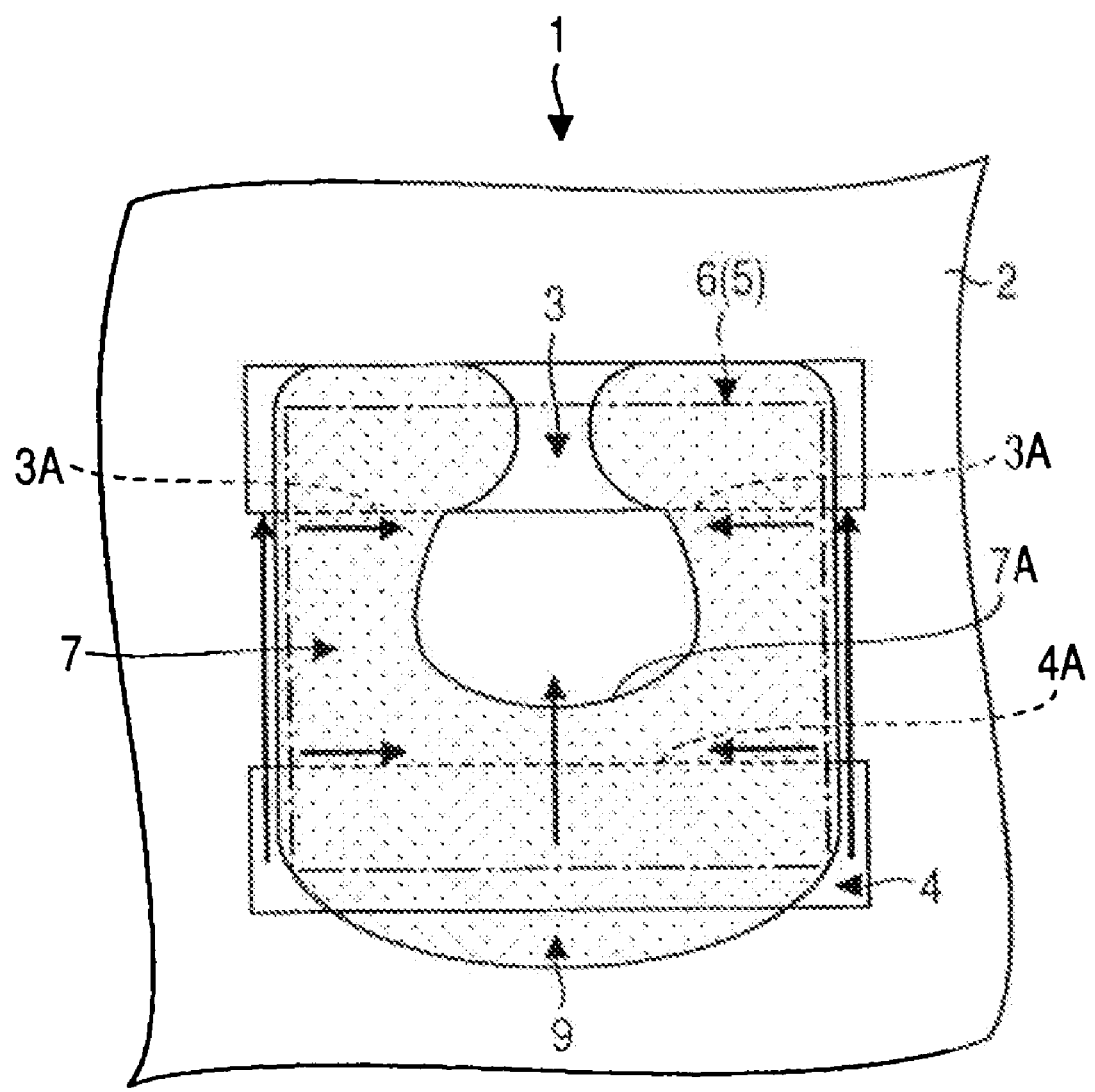
FIG. 4 is a view explaining a flow of the underfill resin in a packaging substrate according to a second related art.
Figure 5:
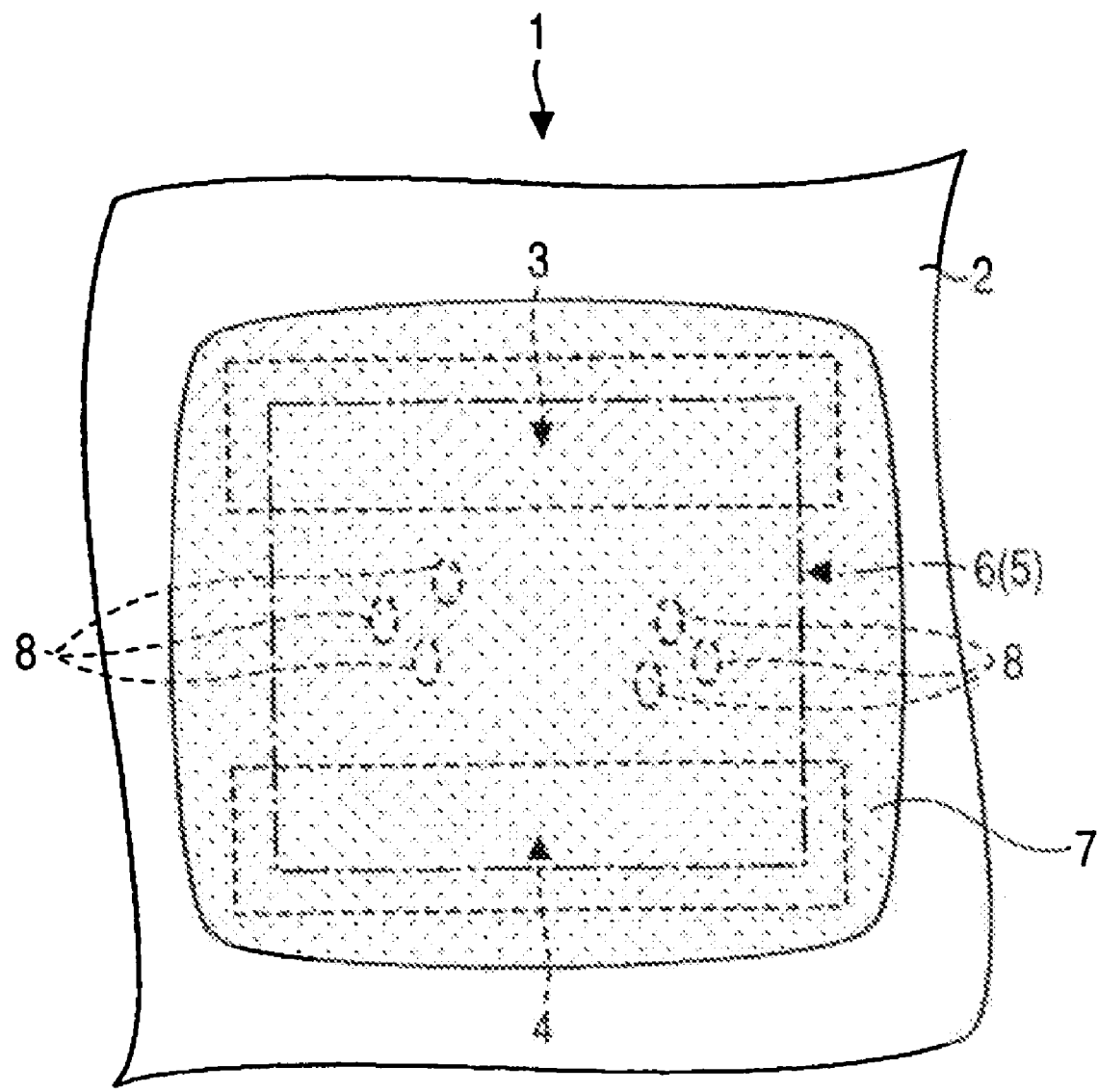
FIG. 5 is a view explaining a problem that is caused in the packaging substrate according to the second related art.
Figure 6B:
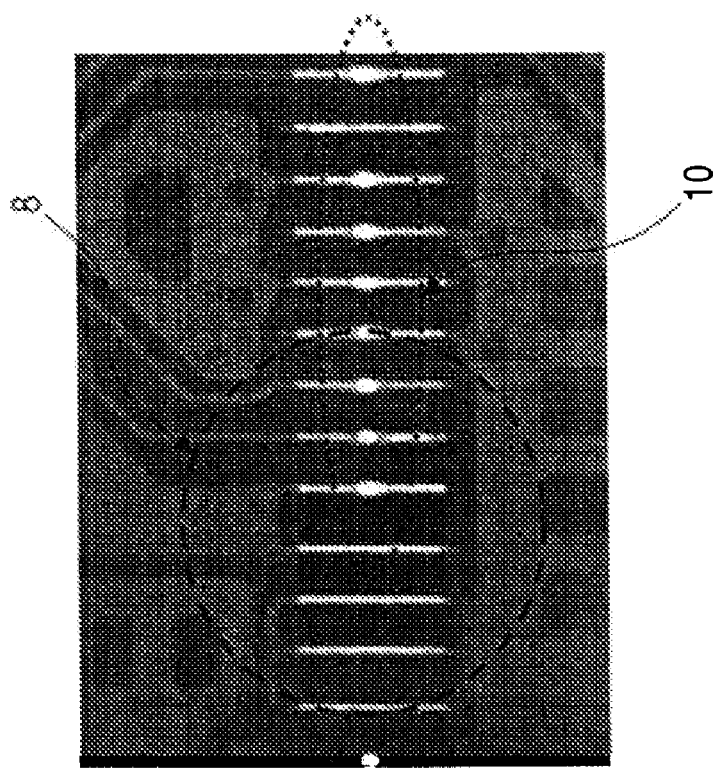
FIG. 6B shows an image when surface grinding is performed in the state shown in FIG. 6A.
Figure 6A:
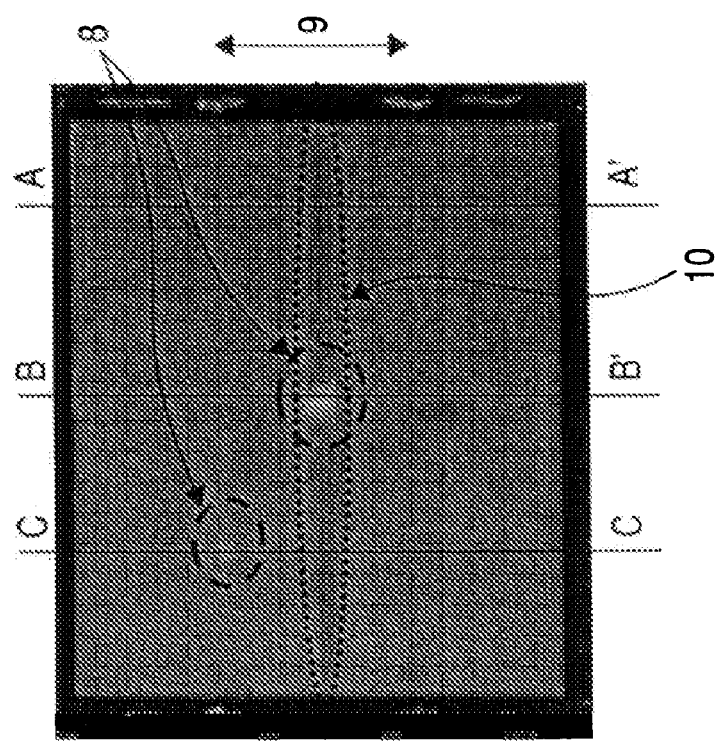
FIG. 6A shows an SAT image in which voids are generated in the inside of an underfill resin when the underfill resin is injected between the packaging substrate and the semiconductor device as the first related art.
Figure 6C:
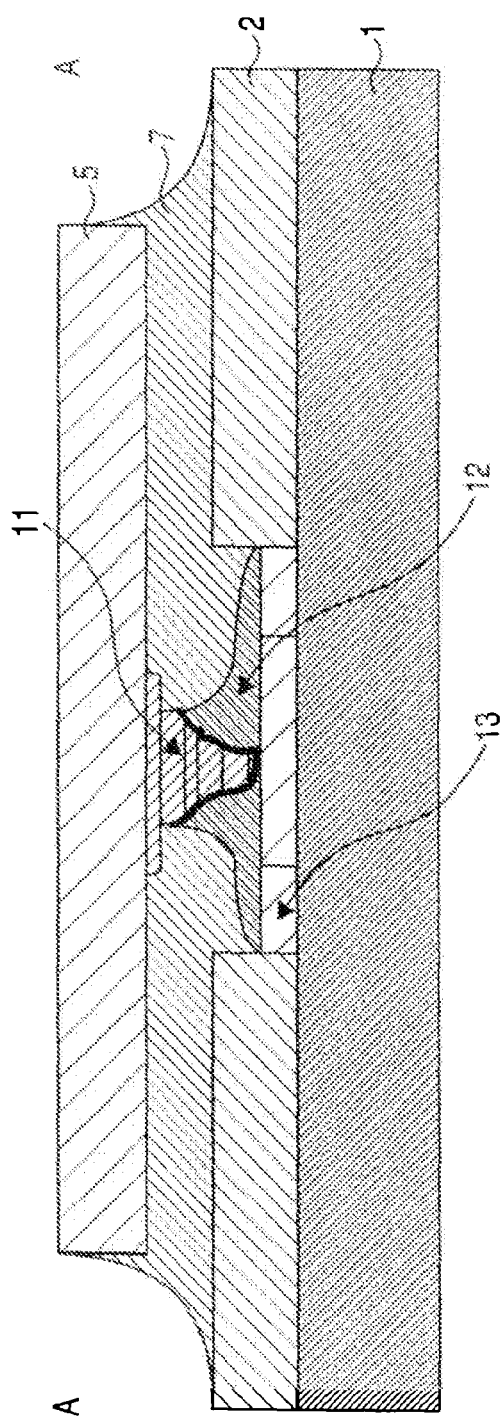
FIG. 6C is a cross-sectional view of a semiconductor device packaging structure along the line A-A' of FIG. 6A.
Figure 6D:
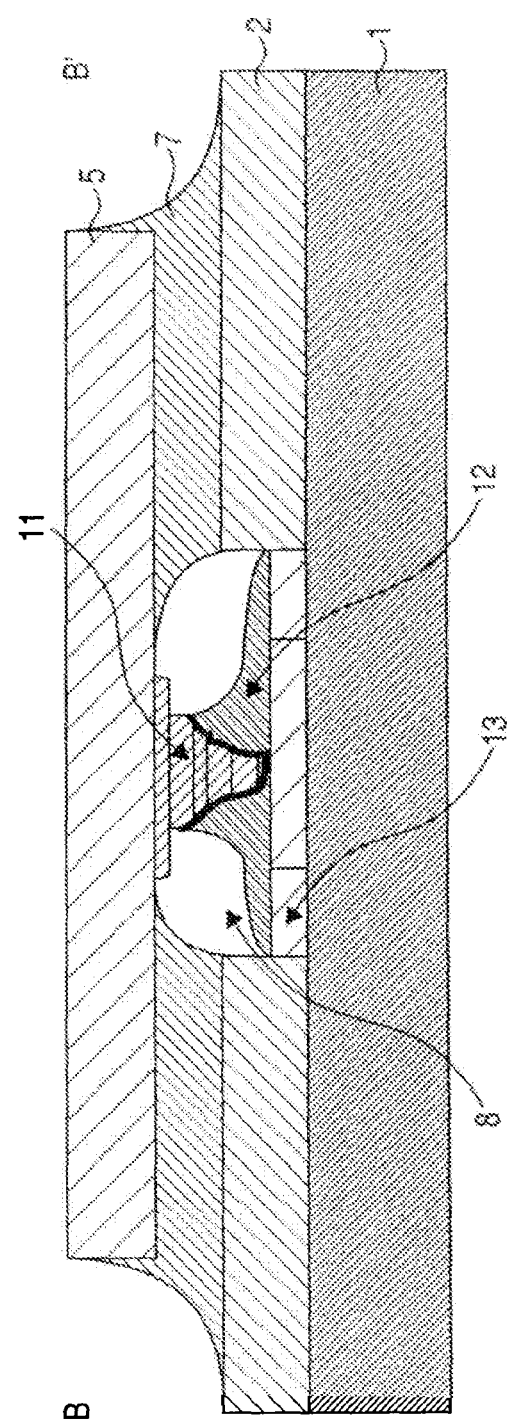
FIG. 6D is a cross-sectional view of the semiconductor device packaging structure along the line B-B' of FIG. 6A.
Figure 6E:
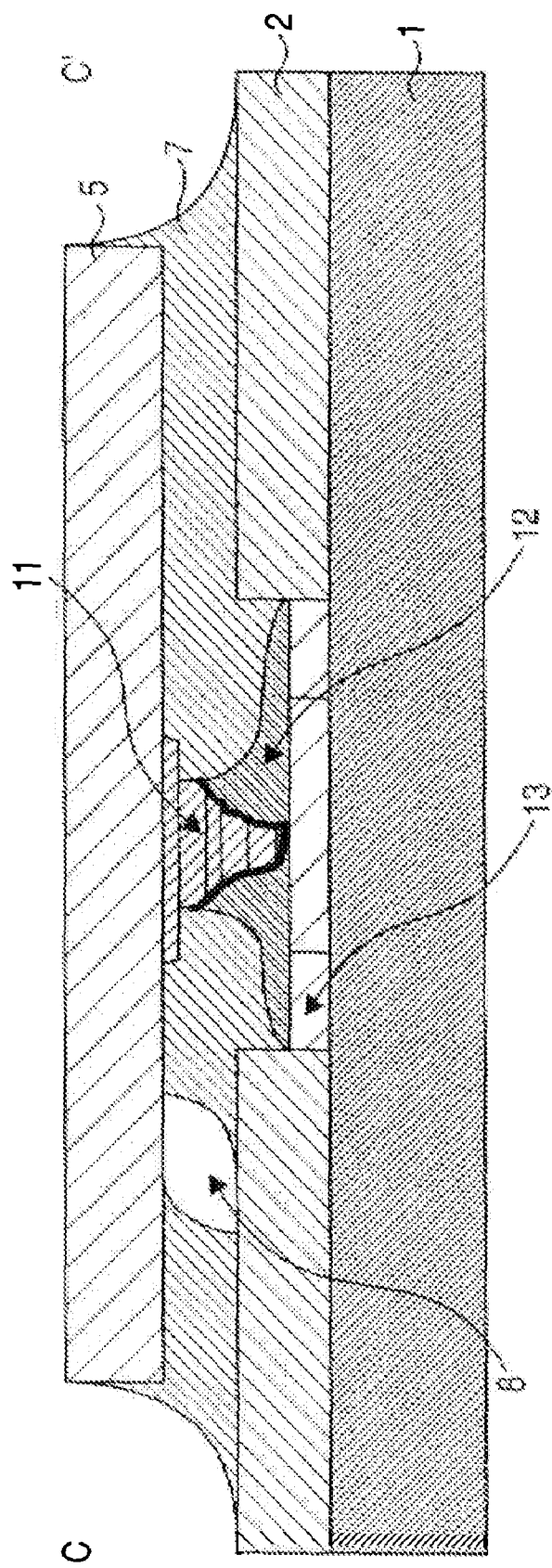
FIG. 6E is a cross-sectional view of the semiconductor device packaging structure along the line C-C' of FIG. 6A.
Figure 7:
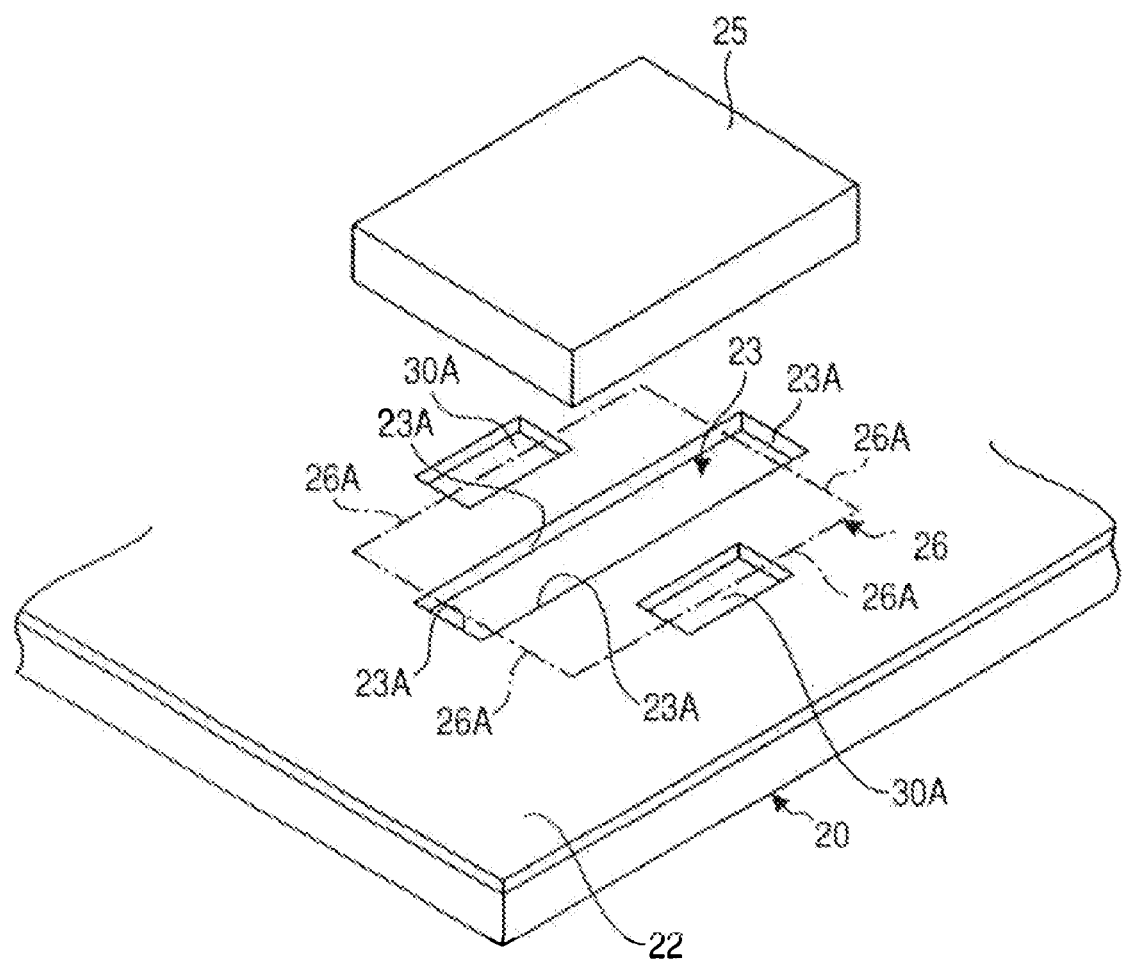
FIG. 7 is a perspective view showing a packaging substrate as a first embodiment of the present invention.

FIG. 7 shows a semiconductor device packaging substrate 20 (referred to as the packaging substrate 20 hereinafter) as a first embodiment of the present invention. A semiconductor device (semiconductor element) 25 is mounted on this packaging substrate 20 by the flip-chip bonding. In FIG. 7, an example in which the semiconductor element 25, such as DRAM, having a center pad structure is mounted is shown.

The packaging substrate 20 is a single-layer or multi-layer printed wiring board, and also predetermined wiring patterns, electrodes, etc. (not shown) made of copper, for example, are formed on its surface. Also, in order to protect the wiring patterns, the electrodes, etc., a solder resist 22 is provided on the surface to improve the soldering described later.

The solder resist 22 is a resin that has insulating performance and also has a function of preventing adhesion of the solder. An opening portion 23 (a first opening portion) is formed in a portion, in which the electrodes to be bonded to the solder bumps formed on the semiconductor device 25 are formed, of a packaging area 26 of the solder resist 22, in which the semiconductor device 25 is mounted. Therefore, the electrodes bonded to the bumps formed on the packaging substrate 20 are exposed to the outside via the opening portion 23.

The solder resist 22 is formed on the packaging substrate 20 by screen-printing method or photographic method. Here, the photographic method is applied to form desired patterns by applying exposing/developing processes using ultraviolet rays, for example, after the solder resist 22 containing a photosensitizer is applied on the packaging substrate 20. The solder resist 22 can be formed easily by either of the screen-printing method and the photographic method.

Also, in the present embodiment, opening portions 30A as a second opening portion are formed on peripheral portions of the opening portion 23 in the solder resist 22. As described later, the opening portion 30A performs a function of adjusting a flow speed when providing underfill resin 27 (This opening portion 30A is referred to as the speed adjusting opening portion 30A hereinafter).

In the present embodiment, a profile of the speed adjusting opening portion 30A is set like a rectangular shape when the packaging substrate 20 is viewed from the top. Also, arranging positions of the speed adjusting opening portions 30A are set in positions facing long sides of the opening portion 23, and partially cover (overlap with) outer peripheral portions 26A of a packaging area 26 for the semiconductor device 25.

The speed adjusting opening portions 30A can be formed simultaneously when the opening portion 23 is formed in the solder resist 22 by the screen-printing method or the photographic method. Thus, such speed adjusting opening portions 30A can be formed easily, not making manufacturing steps complicated. Also, the profile of the speed adjusting opening portions 30A can be changed easily by changing a mask used in the screen-printing method or the photographic method. In particular, since the profile of the speed adjusting opening portions 30A is the rectangular shape as a simple shape in the present embodiment, the speed adjusting opening portions 30A can be formed simply.

The semiconductor device 25 is flip-chip bonded to the packaging substrate 20 constructed as above. In other words, various bumps such as solder bumps and gold bumps (not shown in FIG. 7) are arranged on a bottom surface (circuit formed surface) of the semiconductor device 25, and then the semiconductor device 25 is mounted on the packaging substrate 20 by bonding the bumps to the electrodes formed on the packaging substrate 20 and exposed from the opening portion 23.

In the meanwhile, in the case where a difference in thermal expansion between the packaging substrate 20 and the semiconductor device 25 is large, a stress caused due to such difference in thermal expansion in heating is applied to the bumps when the semiconductor device 25 is flip-chip bonded to the packaging substrate 20. Thus, as described above, a problem arises in packaging reliability. Therefore, in the present embodiment, a stress caused due to a difference in thermal expansion is suppressed by providing the underfill resin 27 between the semiconductor device 25 and the packaging substrate 20 after the semiconductor device 25 is flip-chip mounted on the packaging substrate 20, and thus improvement of the packaging reliability can be achieved.

Then, a process of providing the underfill resin 27 when the packaging substrate 20 according to the present embodiment is employed will be explained hereunder. FIG. 8 to FIG. 11 are plan views showing a flow of the underfill resin 27 when the underfill resin 27 is injected between the packaging substrate 20 and the semiconductor device 25.

Here, because the underfill resin 27 is provided between the packaging substrate 20 and the semiconductor device 25, illustration of the semiconductor device 25 is omitted herein and only its packaging area 26 is illustrated, for convenience of illustration.

In order to provide the underfill resin 27, a liquid underfill resin 27 is injected in a space between the packaging substrate 20 and the semiconductor device 25 from an injection starting position 29. In an example shown in FIG. 8, the injection starting position 29 is set in a position of the bottom portion of the opening portion 23. The underfill resin 27 when injected from the injection starting position 29 flows upward in FIG. 8 because of a capillarity (in the direction indicated with an arrow X in FIG. 8) to spread into a space between the packaging substrate 20 and the semiconductor device 25.

Figure 8:
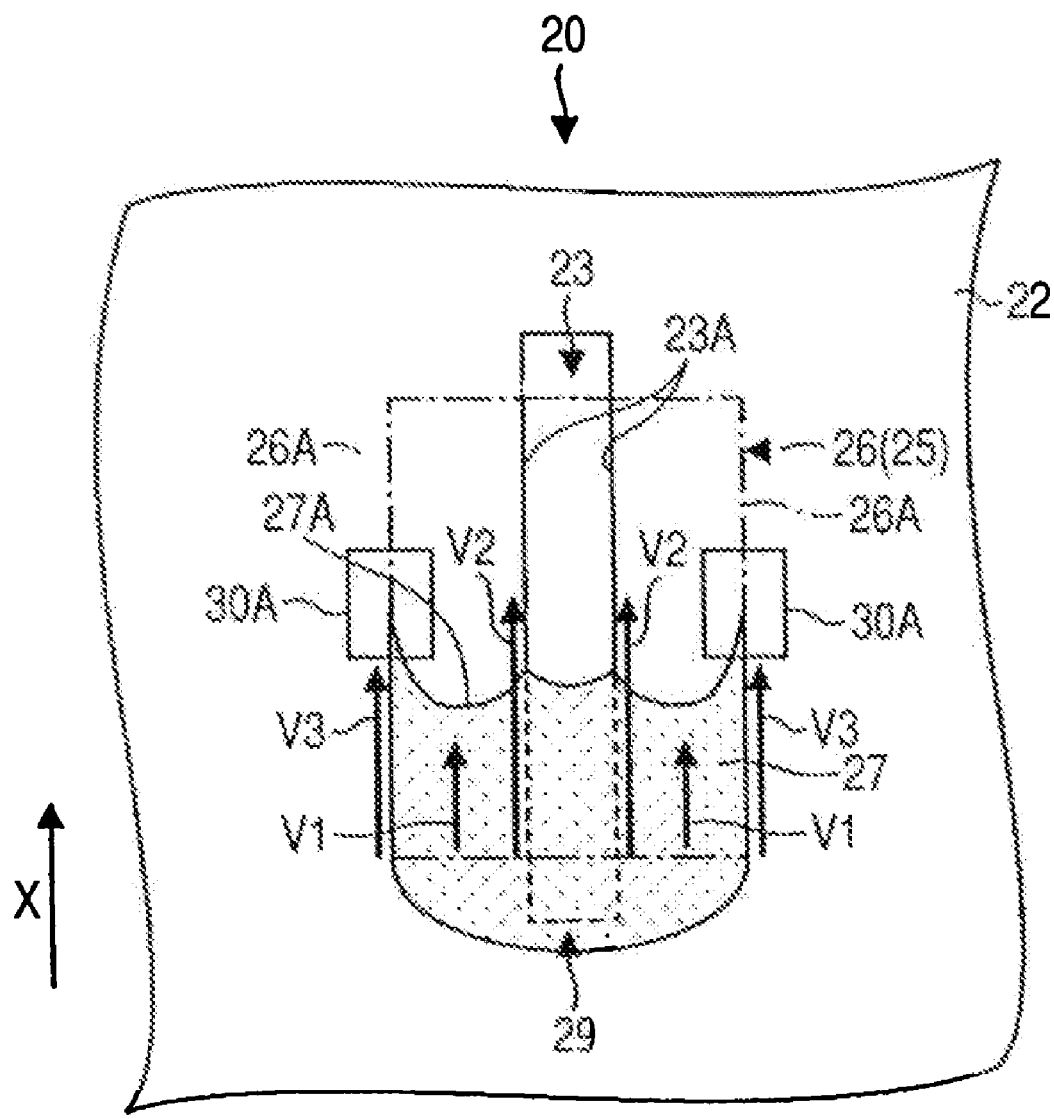
FIG. 8 is a view (#1) explaining a flow of the underfill resin in the packaging substrate as a first embodiment of the present invention.

In this injection, a flow of the underfill resin 27 is not changed from the related art, as shown in FIG. 8, until such flow of the underfill resin 27 reaches the speed adjusting opening portion 30A. That is, a flow end surface 27A as a top end portion of the underfill resin 27 is not formed as a linear end but a curved end shown in FIG. 8.

As described above, this is caused due to the fact that a flow speed of the liquid underfill resin 27 in areas that are located along edge portions 23A of the opening portion 23 and outer peripheral portions 26A of the semiconductor device 25 is higher than that in other areas. Therefore, a flow speed V2 at the edge portion 23A and a flow speed V3 at the outer peripheral portion 26A is higher than a flow speed of the underfill resin 27 on the solder resist 22 indicated with an arrow V1 in FIG. 8 (V1<V2, V1<V3).

When the underfill resin 27 goes past the position shown in FIG. 8 and reaches the speed adjusting opening portion 30A, such underfill resin 27 enters into the speed adjusting opening portion 30A. At this time, in the present embodiment, because the speed adjusting opening portion 30A is formed in the position containing the outer peripheral portion 26A in which the flow speed of the underfill resin 27 is fast, the underfill resin 27 having the fast flow speed flows into the speed adjusting opening portion 30A.

Since the underfill resin 27 that entered into the speed adjusting opening portion 30A flows such that the flow end surface 27A moves along the outer periphery of the speed adjusting opening portion 30A, a distance in which the underfill resin 27 flows (distance of the outer periphery) becomes longer. Also, since the underfill resin 27 flows in the speed adjusting opening portion 30A constructed as a recessed area, such underfill resin 27 does not go forward in the X direction to exceed the speed adjusting opening portion 30A until the speed adjusting opening portion 30A is filled with the underfill resin 27.

Figure 9:
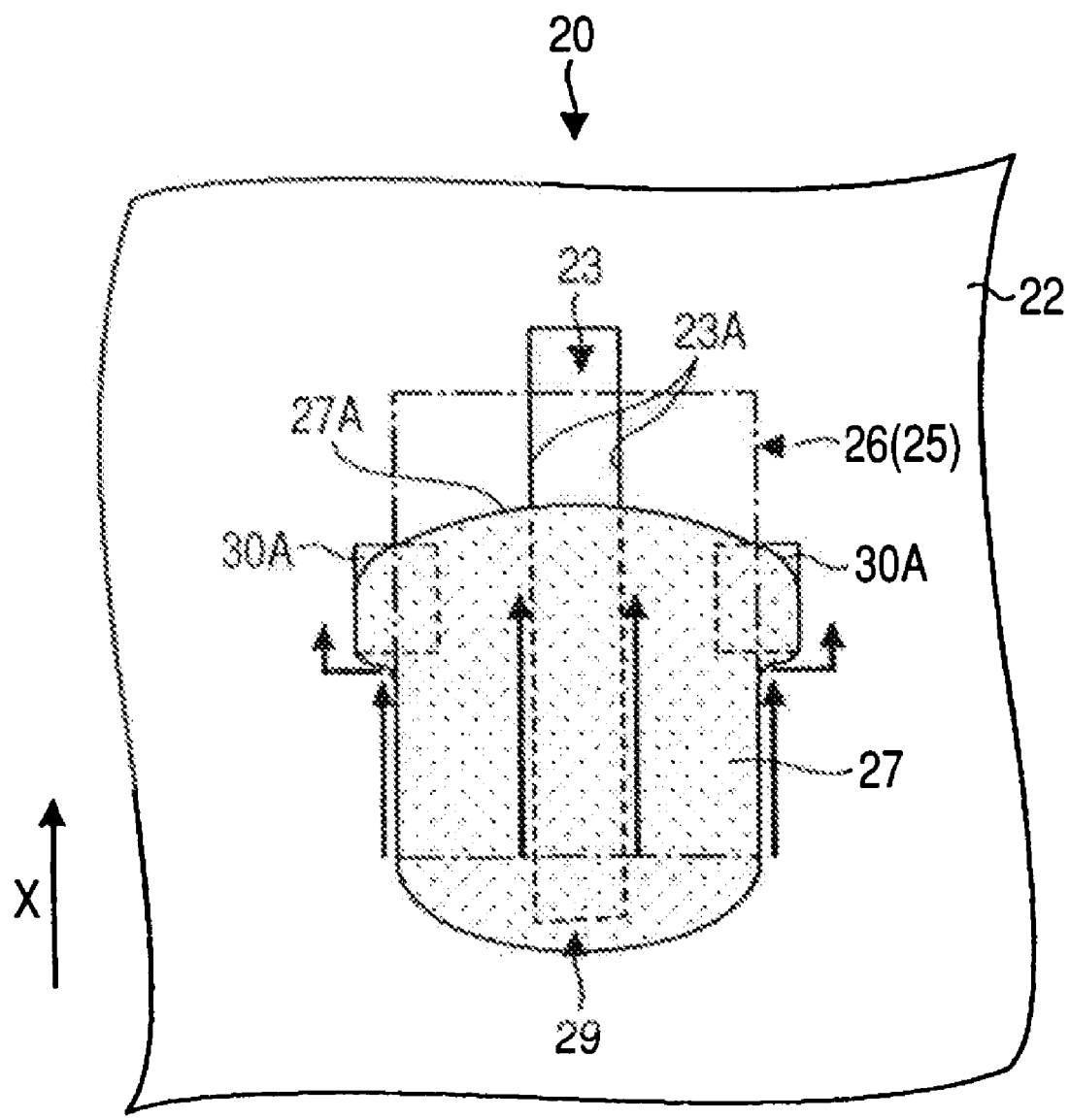
FIG. 9 is a view (#2) explaining a flow of the underfill resin in the packaging substrate as a first embodiment of the present invention.

In other words, because the speed adjusting opening portion 30A is formed, the flow speed of the underfill resin 27 passing through the speed adjusting opening portion 30A can be made slow rather than the flow speed in other portions. In this manner, since the flow speed of the underfill resin 27 is adjusted by the speed adjusting opening portion 30A, the flow end surface 27A of the underfill resin 27 gives an almost uniform and smooth end, as shown in FIG. 9, at a point of time when the underfill resin 27 passes through the speed adjusting opening portion 30A.

Figure 10:
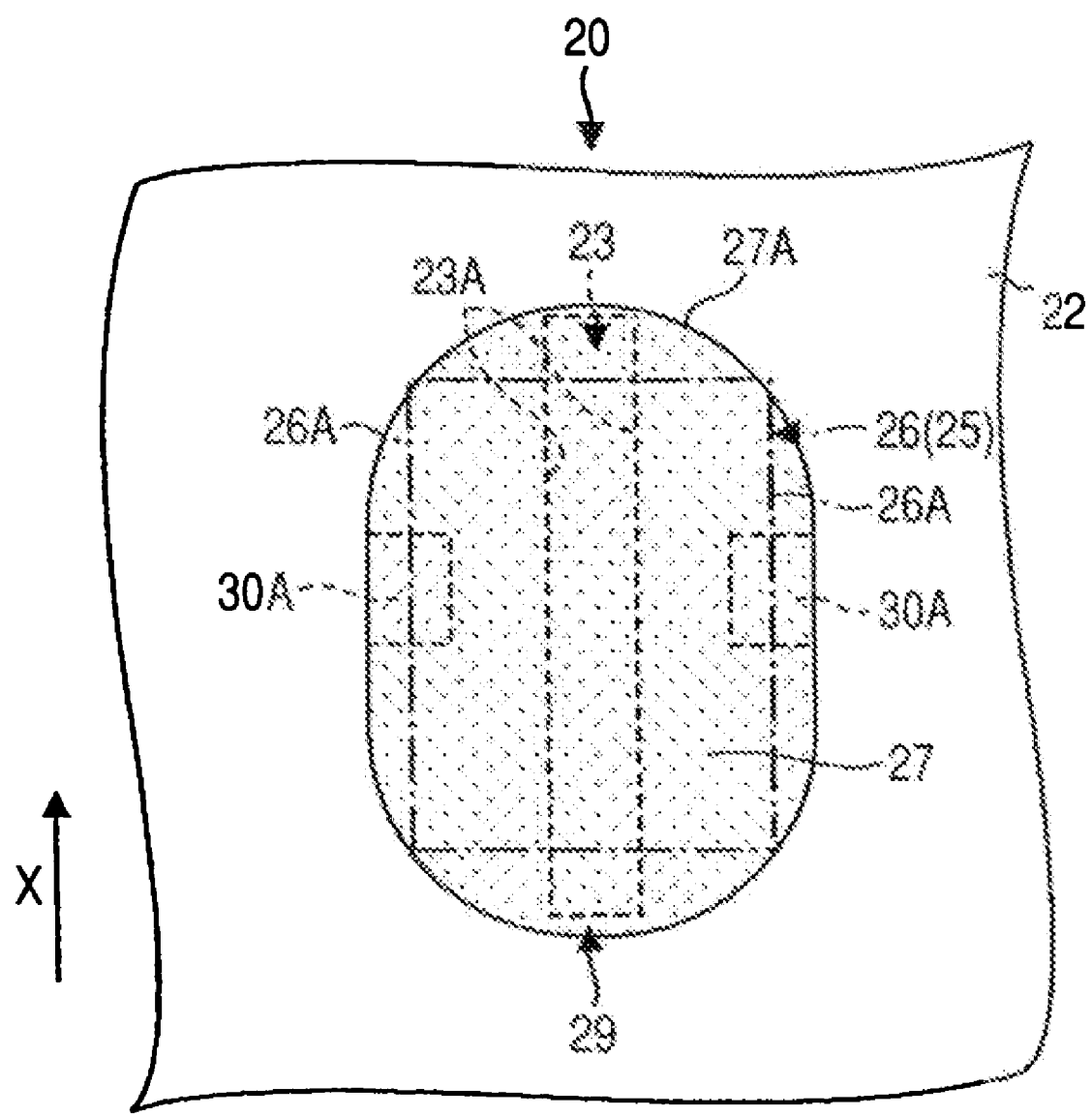
FIG. 10 is a view (#3) explaining a flow of the underfill resin in the packaging substrate as a first embodiment of the present invention.

FIG. 10 shows a situation that the underfill resin 27 goes forward further in the X direction. As shown in FIG. 10, because the opening portion 23 is present in the center of the packaging area 26, the flow speed of the underfill resin 27 on the long side is increased by the edge portion 23A, while the flow speed of the underfill resin 27 on the outer peripheral portion 26A is decreased by the presence of the speed adjusting opening portion 30A. Therefore, as shown in FIG. 10, the underfill resin 27 goes forward in an egg-shaped end as a whole (the flow end surface 27A gives a curve whose center portion is protruded upwards).

Figure 11:
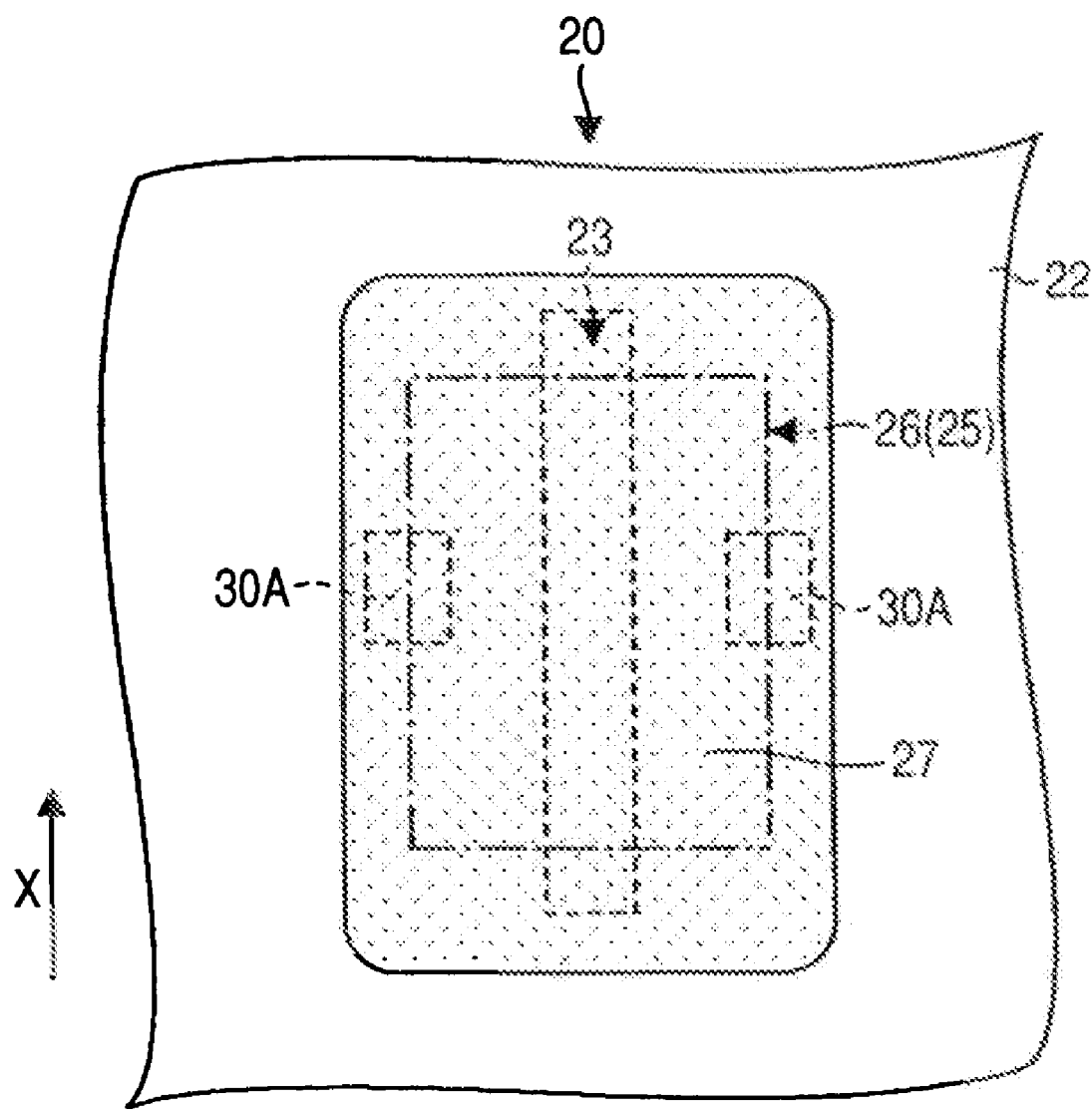
FIG. 11 is a view (#4) explaining a flow of the underfill resin in the packaging substrate as a first embodiment of the present invention.

FIG. 11 shows a situation that a process of providing the underfill resin 27 is ended. As shown in FIG. 10, in the present embodiment, because the speed adjusting opening portion 30A is provided in the packaging substrate 20, a flow distribution of the underfill resin 27 gives such a distribution that the flow end surface 27A constitutes an almost uniform and smooth end.

More concretely, as shown in FIG. 10, the underfill resin 27 flows in such a manner that a center portion goes ahead for some amount and both side portions follow the center portion slightly late. As a result, unlike the related art, it can be prevented that the underfill resin shows such a flow that the underfill resin goes around fast while leaving the center portion, and also it can be prevented that the voids are generated in the underfill resin 27. In this manner, since generation of the voids in the underfill resin 27 can be suppressed, the packaging reliability in mounting the semiconductor device 25 on the packaging substrate 20 can be increased.

In addition, the underfill resin 27 still remains in the speed adjusting opening portion 30A after the providing process is ended. Therefore, since the underfill resin 27 in the speed adjusting opening portion 30A has an anchor effect with respect to the packaging substrate 20, the underfill resin 27 can be secured to the packaging substrate 20 without fail. As a result, the packaging reliability in mounting the semiconductor device 25 on the packaging substrate 20 can be increased further.

In the present embodiment, two speed adjusting opening portions 30A are provided to face the long sides of the opening portion 23, and the opening portion 23 is provided between them. But a number of the speed adjusting opening portions 30A being arranged is not limited to two, and a plurality of speed adjusting opening portions may be employed.

Also, the arranging position is not limited to the positions shown in the present embodiment. The position may be selected appropriately to correspond to the flow of the underfill resin 27. For example, the speed adjusting opening portion may be provided on the opposite side to the injection starting position 29 of the opening portion 23. With this configuration, it can be prevented that the underfill resin 27 flows out excessively from the packaging area 26 to the outside.

Furthermore, the shape of the speed adjusting opening portion is not limited to the rectangular shape when viewed from the top. The speed adjusting opening portion may be in any shape as long as the underfill resin 27 is filled inside so as to prevent that the underfill resin goes around fast while leaving the center portion.

Next, second to sixth embodiments of the present invention will be explained with FIG. 12 to FIG. 17 hereunder. In FIG. 12 to FIG. 17, the same reference symbols are affixed to the same configurations as those shown in FIG. 7 to FIG. 11 used in the explanation in the first embodiment, and their explanation will be omitted herein.

Figure 12:
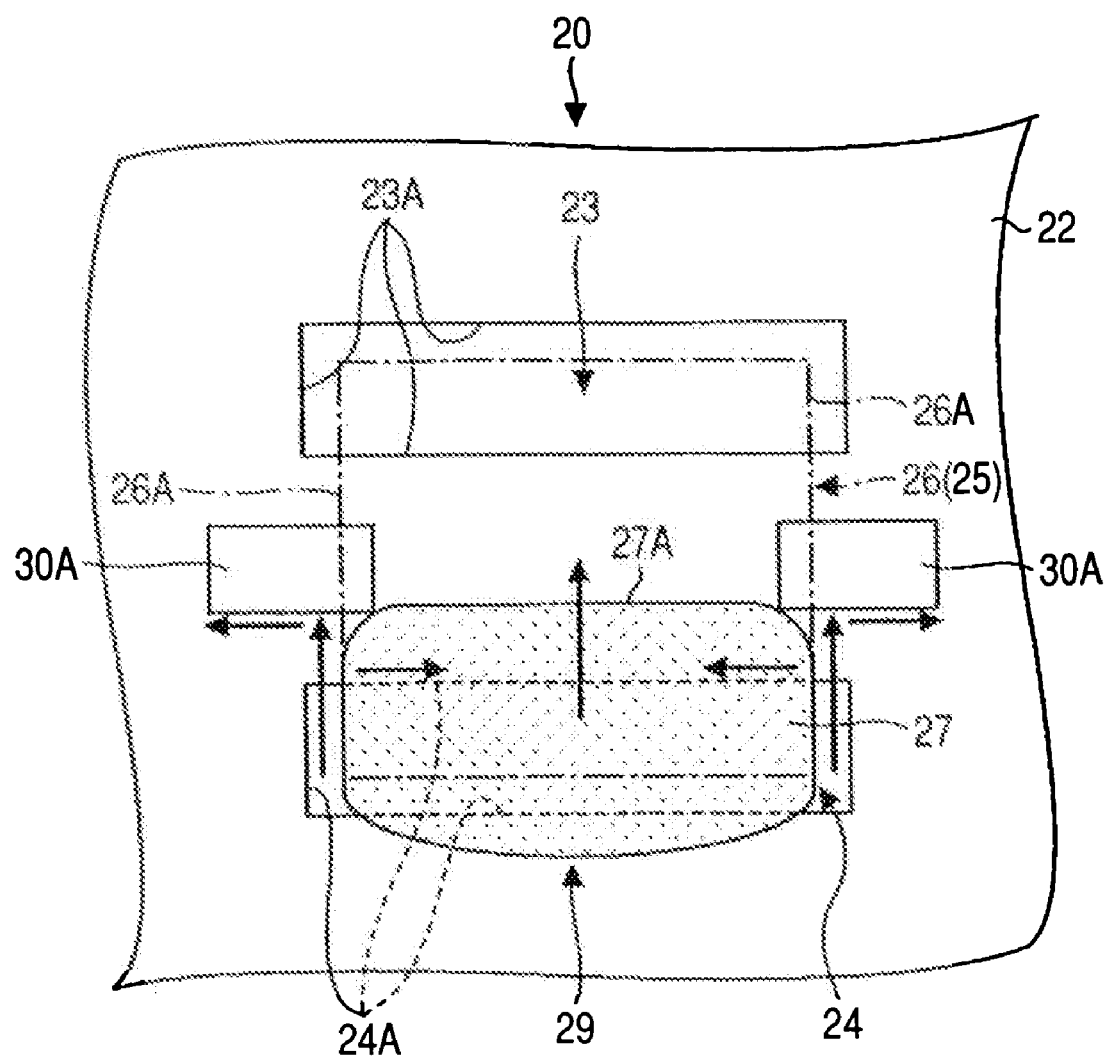
FIG. 12 is a plan view of a packaging substrate as a second embodiment of the present invention.

FIG. 12 shows the packaging substrate 20 as a second embodiment of the present invention. In the present embodiment, an example in which two opening portions 23, 24 are formed in the solder resist 22 to mount the semiconductor device having the pad structure in two rows is illustrated. The opening portions 23, 24 are arranged in parallel with each other, and the underfill resin 27 is injected in the direction that is perpendicular to the extending direction (the lateral direction in FIG. 12) of the opening portions 23, 24.

Also, the present embodiment is constructed such that the speed adjusting opening portion 30A is formed between the opening portion 23 and the opening portion 24. As in the present embodiment, even in the configuration that two opening portions 23, 24 are arranged in the moving direction of the underfill resin 27 and the underfill resin 27 is subject to go around along edges, the going-around of the underfill resin 27 can be suppressed and also generation of the voids can be prevented since the flow speed of the underfill resin 27 is adjusted by the speed adjusting opening portion 30A.

Figure 13:
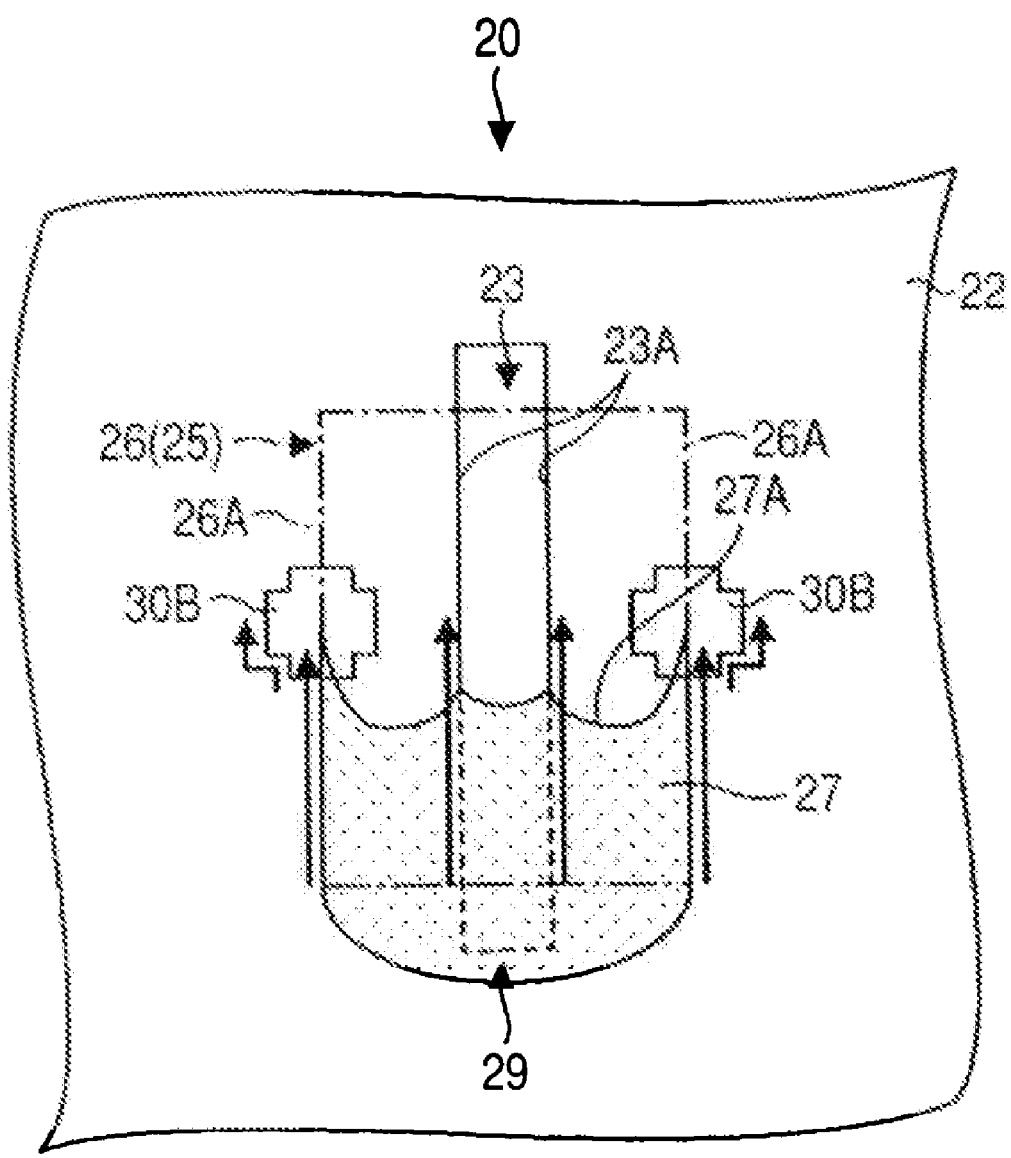
FIG. 13 is a plan view of a packaging substrate as a third embodiment of the present invention.
Figure 14:
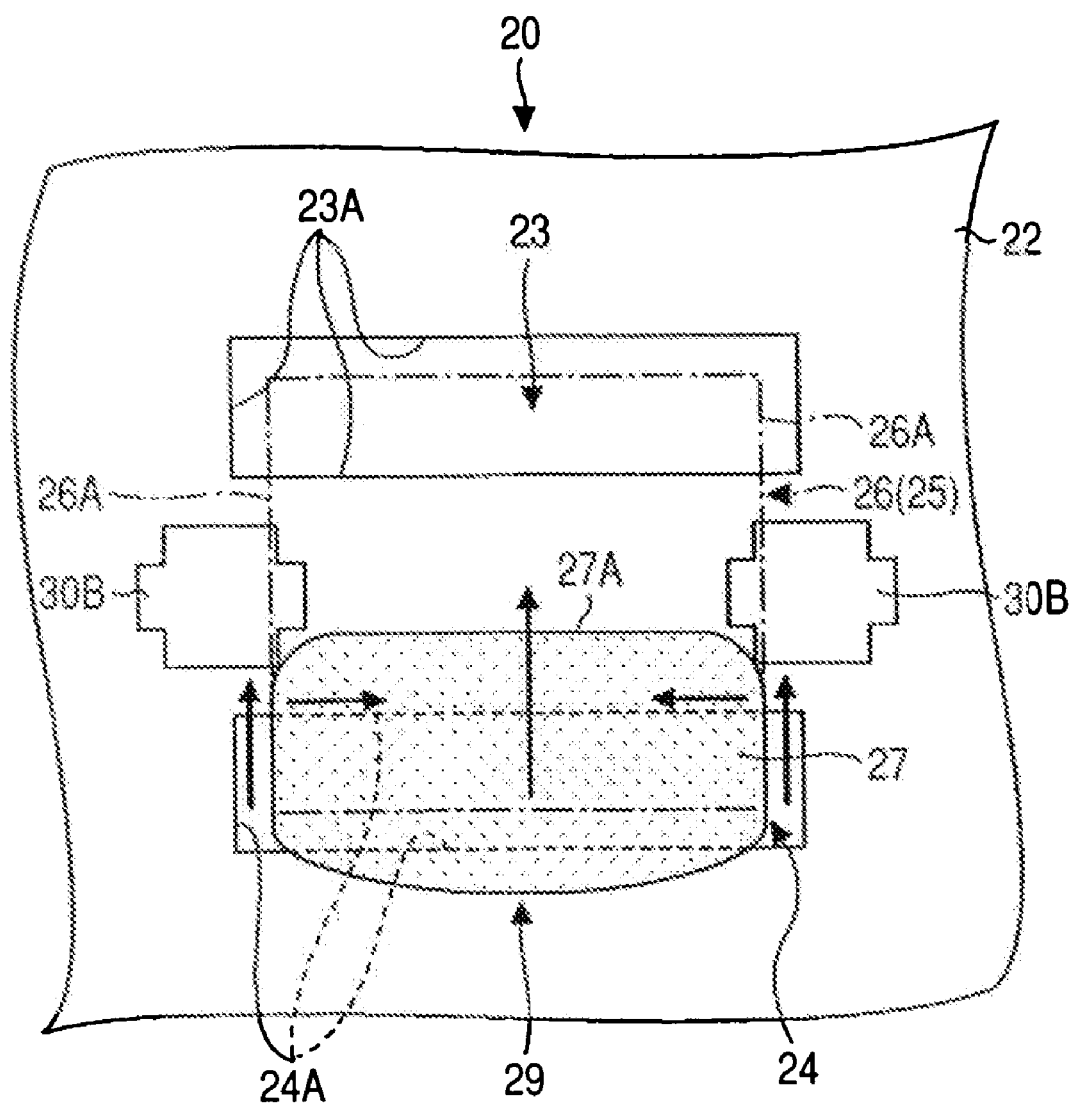
FIG. 14 is a plan view of a packaging substrate as a fourth embodiment of the present invention.

FIG. 13 and FIG. 14 show the packaging substrates 20 as third and fourth embodiments of the present invention. In the packaging substrates 20 according to the third and fourth embodiments, the adjusting section for adjusting the flow speed of the underfill resin 27 is shaped into a polygonal shape when viewed from the top. FIG. 13 shows an example in which a cross-like shaped speed adjusting opening portion 30B is applied to the packaging substrate 20 having one opening portion 23. Also, FIG. 14 shows an example in which the cross-like shaped speed adjusting opening portion 30B is applied to the packaging substrate 20 having two opening portions 23, 24.

In this manner, because the speed adjusting opening portion 30B is shaped into the polygonal shape, the flow speed of the underfill resin 27 can be reduced largely. Therefore, the flow speed of the underfill resin 27 can be decreased largely by a small space, and it can be prevented that a dead space is generated on the packaging substrate 20 when the speed adjusting opening portion 30B is provided.

Accordingly, improvement of the packaging reliability can be achieved while attaining a size reduction of the packaging substrate 20. In the present embodiment, a cross-like shape is used as an example of a polygonal shape, but the polygonal shape is not limited to this shape.

Figure 15:
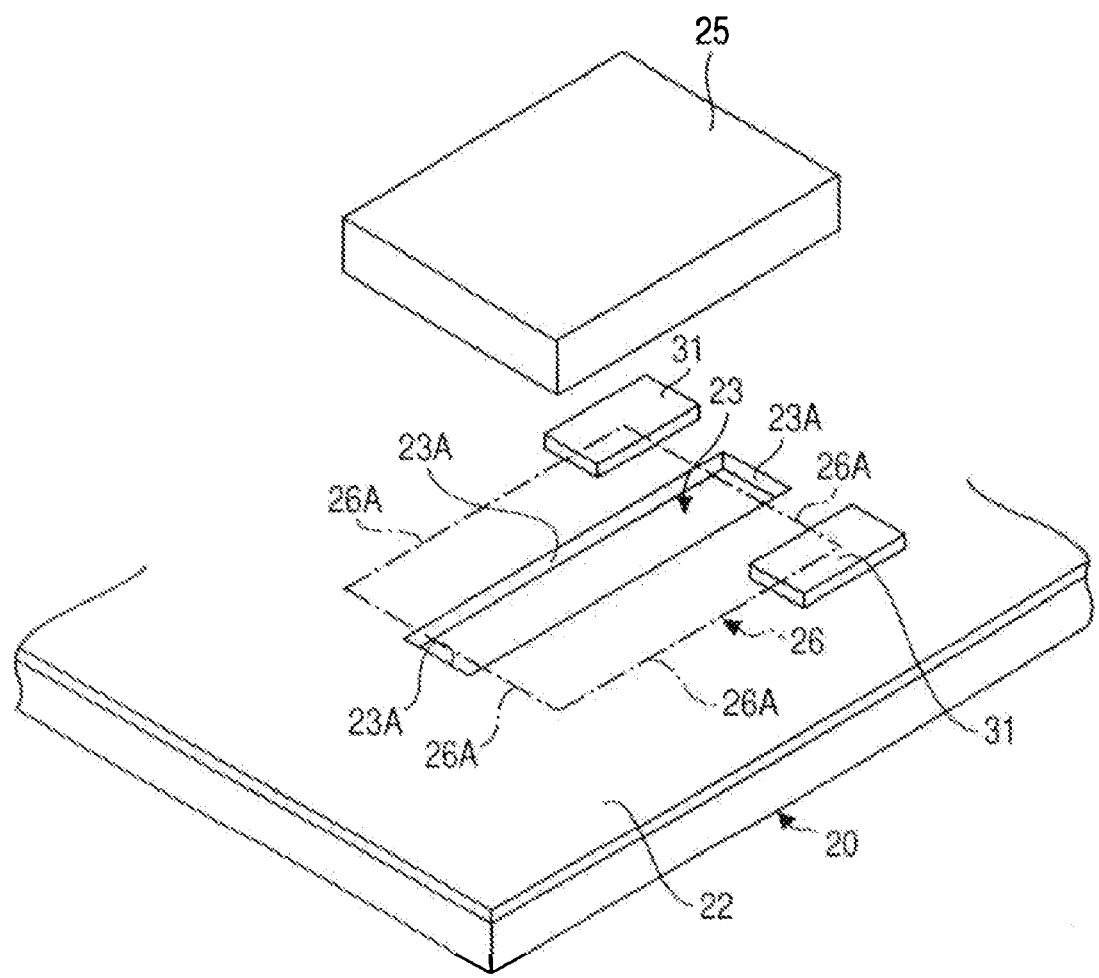
FIG. 15 is a perspective view of a packaging substrate as a fifth embodiment of the present invention.
Figure 16:
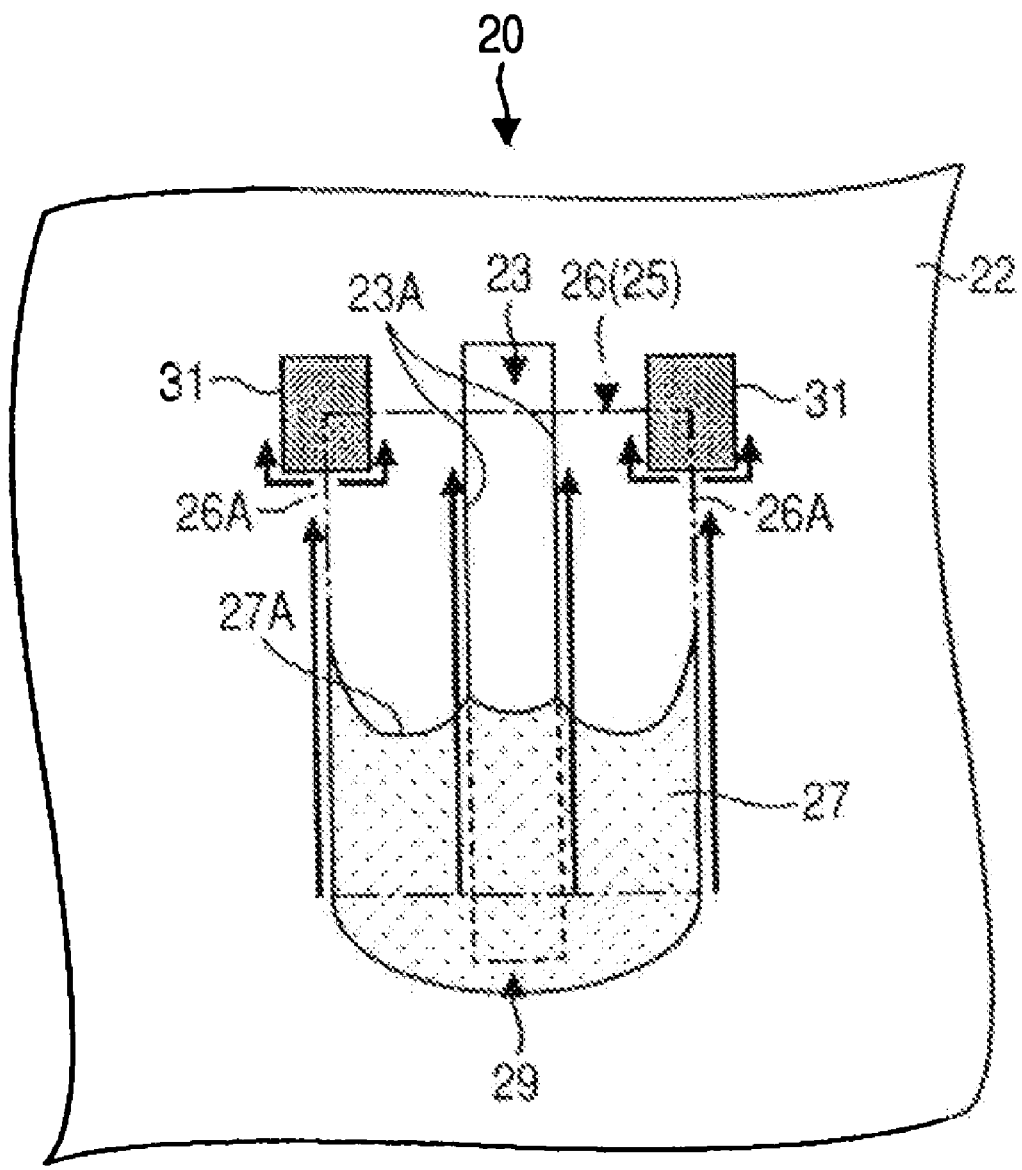
FIG. 16 is a plan view of the packaging substrate as the fifth embodiment of the present invention.
Figure 17:
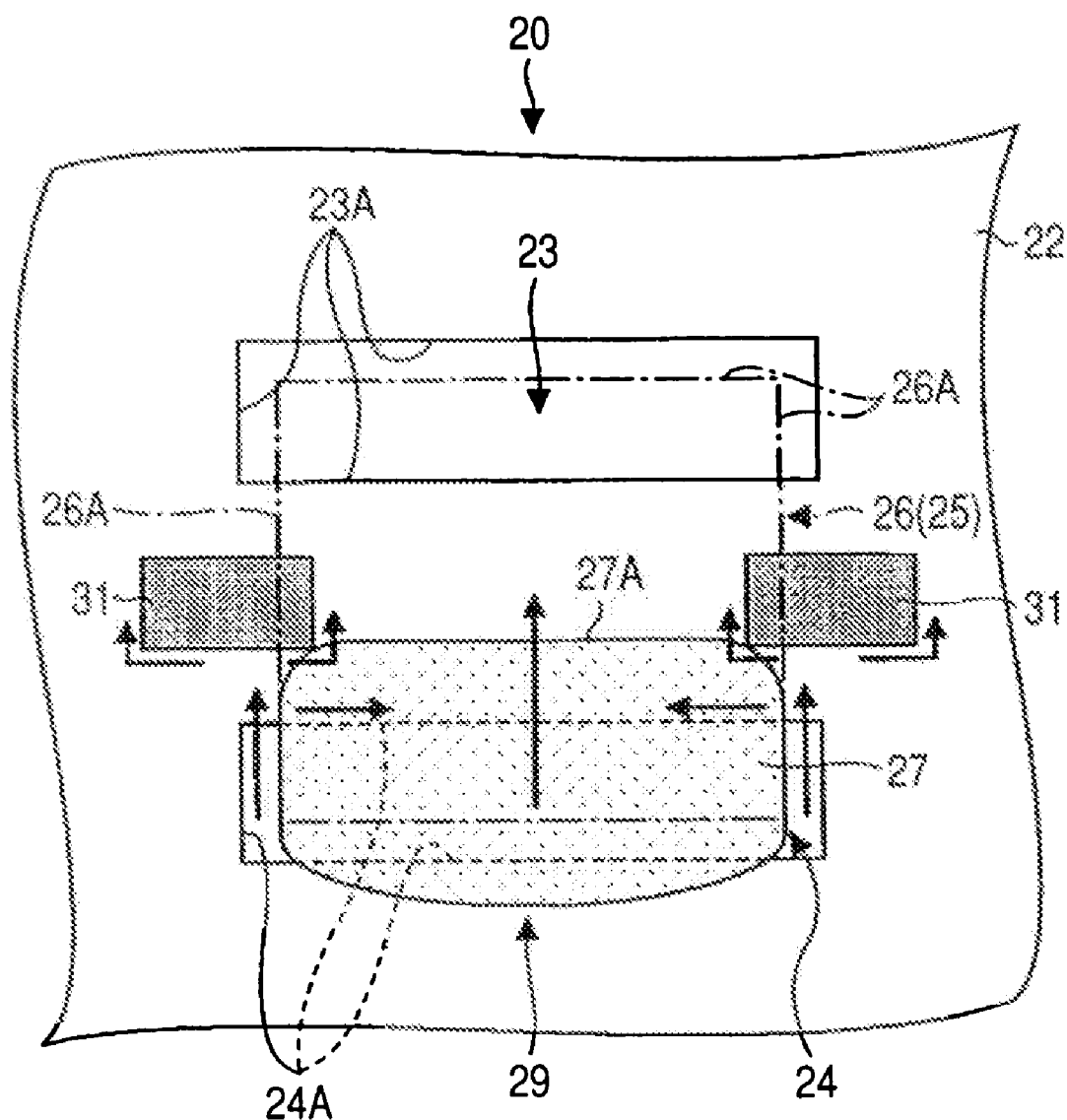
FIG. 17 is a plan view of a packaging substrate as a sixth embodiment of the present invention.

FIG. 15 to FIG. 17 show the packaging substrates 20 as fifth and sixth embodiments of the present invention.

In the above embodiments, the flow speed of the underfill resin 27 is made slow by forming the opening portions 23, 24 in the solder resist 22 and forming the recess portion on the surface of the packaging substrate 20. In contrast, in the packaging substrates 20 as the fifth and sixth embodiments, speed adjusting convex portions 31 are formed on the solder resist 22 as the adjusting section to adjust the flow speed of the underfill resin 27.

The speed adjusting convex portions 31 are convex portions that are formed integrally with the solder resist 22, as shown in FIG. 15, and are formed simultaneously when the solder resist 22 is formed. Concretely, the speed adjusting convex portions 31 are formed by providing the convex solder resist on the solder resist 22 by screen printing, or the like. Also, a height of the speed adjusting convex portions 31 is set almost equal to or slightly lower than a clearance between the semiconductor device 25 and the packaging substrate 20 when normally the semiconductor device 25 is flip-chip bonded to the packaging substrate 20.

FIG. 15 and FIG. 16 show an example in which the speed adjusting convex portions 31 are applied to the packaging substrate 20 having one opening portion 23. Also, FIG. 17 show an example in which the speed adjusting convex portions 31 are applied to the packaging substrate 20 having two opening portions 23, 24. As shown in FIG. 15 and FIG. 16, since the speed adjusting convex portions 31 are formed on the solder resist 22, the speed adjusting convex portions 31 serve as a dam to prevent the flow of the underfill resin 27 when the underfill resin 27 comes up to the speed adjusting convex portions 31. Accordingly, the flow speed of the underfill resin 27 can be decreased, and also generation of the voids in the underfill resin 27 can be prevented.

Also, as shown FIG. 15 and FIG. 16, since the speed adjusting convex portions 31 are formed at corner portions on the opposite side to the injection starting position 29 of the packaging area 26, it can be prevented that the underfill resin 27 flows out unnecessarily to the outside from the packaging area 26.

It will be apparent to those skilled in the art that various modifications and variations can be made to the described preferred embodiments of the present invention without departing from the spirit or scope of the invention. Thus, it is intended that the present invention cover all modifications and variations of this invention consistent with the scope of the appended claims and their equivalents.

What is claimed is:

1. A packaging substrate for a semiconductor device, the packaging substrate comprising:
   a solder resist on a surface of the packaging substrate, the solder resist having a first opening portion for mounting the semiconductor device; and
   an adjusting section for adjusting a flow speed of an underfill resin when the underfill resin is provided, the adjusting section being positioned in vicinity of the first opening portion of the solder resist.

2. The packaging substrate according to claim 1, wherein the adjusting section includes a second opening portion formed in the solder resist.

3. The packaging substrate according to claim 1, wherein the adjusting section includes a convex portion formed on the solder resist.

4. The packaging substrate according to claim 2, wherein the adjusting section is rectangular-shaped when viewed from a top.

5. The packaging substrate according to claim 3, wherein the adjusting section is rectangular-shaped when viewed from a top.

6. The packaging substrate according to claim 2, wherein the adjusting section is polygonal-shaped when viewed from a top.

7. The packaging substrate according to claim 3, wherein the adjusting section is polygonal-shaped when viewed from a top.

8. The packaging substrate according to claim 1, wherein the adjusting section is provided on one side of the first opening portion, the side that is opposite to an injection starting position of the underfill resin.

9. The packaging substrate according to claim 1, wherein the adjusting section is formed in a position partially covering an outer periphery of a region in which the semiconductor device is mounted.

10. A packaging structure comprising:
    a packaging substrate;
    a semiconductor device mounted in the packaging substrate in flip-chip bonding; and
    an underfill resin provided between the semiconductor device and the packaging substrate,
    wherein the packaging substrate includes:
    a solder resist on a surface of the packaging substrate, the solder resist having a first opening portion for mounting the semiconductor device; and
    an adjusting section for adjusting a flow speed of the underfill resin when the underfill resin is provided, the adjusting section being positioned in vicinity of the first opening portion of the solder resist, and
    the underfill resin is provided in a region including the first opening portion and the adjusting section.

* * * * *